United States Patent
Liu

(10) Patent No.: US 11,503,675 B2
(45) Date of Patent: Nov. 15, 2022

(54) HIGH-FREQUENCY ELECTROMAGNETIC INDUCTION CONTROL CIRCUIT

(71) Applicant: Shenzhen Eigate Technology Co., Ltd., Shenzhen (CN)

(72) Inventor: Tuanfang Liu, Shenzhen (CN)

(73) Assignee: SHENZHEN EIGATE TECHNOLOGY CO., LTD., Shenzhen (CN)

( * ) Notice: Subject to any disclaimer, the term of this patent is extended or adjusted under 35 U.S.C. 154(b) by 228 days.

(21) Appl. No.: 17/128,249

(22) Filed: Dec. 21, 2020

(65) Prior Publication Data

US 2022/0151032 A1 May 12, 2022

(30) Foreign Application Priority Data

Nov. 10, 2020 (CN) .......................... 202011250692.7

(51) Int. Cl.
  *H02J 7/00* (2006.01)
  *H05B 6/06* (2006.01)
  *G01R 31/3832* (2019.01)
  *H01M 10/42* (2006.01)
  *H01M 10/44* (2006.01)

(52) U.S. Cl.
  CPC ........... *H05B 6/06* (2013.01); *G01R 31/3832* (2019.01); *H01M 10/4285* (2013.01); *H01M 10/443* (2013.01); *H02J 7/00304* (2020.01); *H02J 7/00308* (2020.01)

(58) Field of Classification Search
  None
  See application file for complete search history.

(56) References Cited

U.S. PATENT DOCUMENTS

| | | | |
|---|---|---|---|
| 10,193,462 B1 * | 1/2019 | Leong .................... | H02M 7/797 |
| 2011/0241625 A1 * | 10/2011 | LoCascio .................. | H02J 7/00 320/140 |
| 2018/0130589 A1 * | 5/2018 | Yonak .................. | H01F 27/2895 |

* cited by examiner

*Primary Examiner* — Arun C Williams
(74) *Attorney, Agent, or Firm* — Matthias Scholl P.C.; Matthias Scholl

(57) ABSTRACT

A high-frequency electromagnetic induction control circuit includes a charging control circuit, a battery control and protection circuit, a battery, a main control MCU, a display control circuit, a keyboard control circuit, a drive circuit, a high-frequency heating circuit, and an induction heating circuit. The charging control circuit supplies a charging voltage and a charging current for the battery. The battery control and protection circuit is configured to detect whether the charging voltage and the charging current are qualified. The battery supplies power for the main control MCU. The main control MCU is configured to detect an input voltage of the battery, and the display control circuit sends out a signal whether the battery is in an under-voltage state. The keyboard control circuit is configured to control the main control MCU to operate. The output voltage of the main control MCU is boosted by the drive circuit.

9 Claims, 24 Drawing Sheets

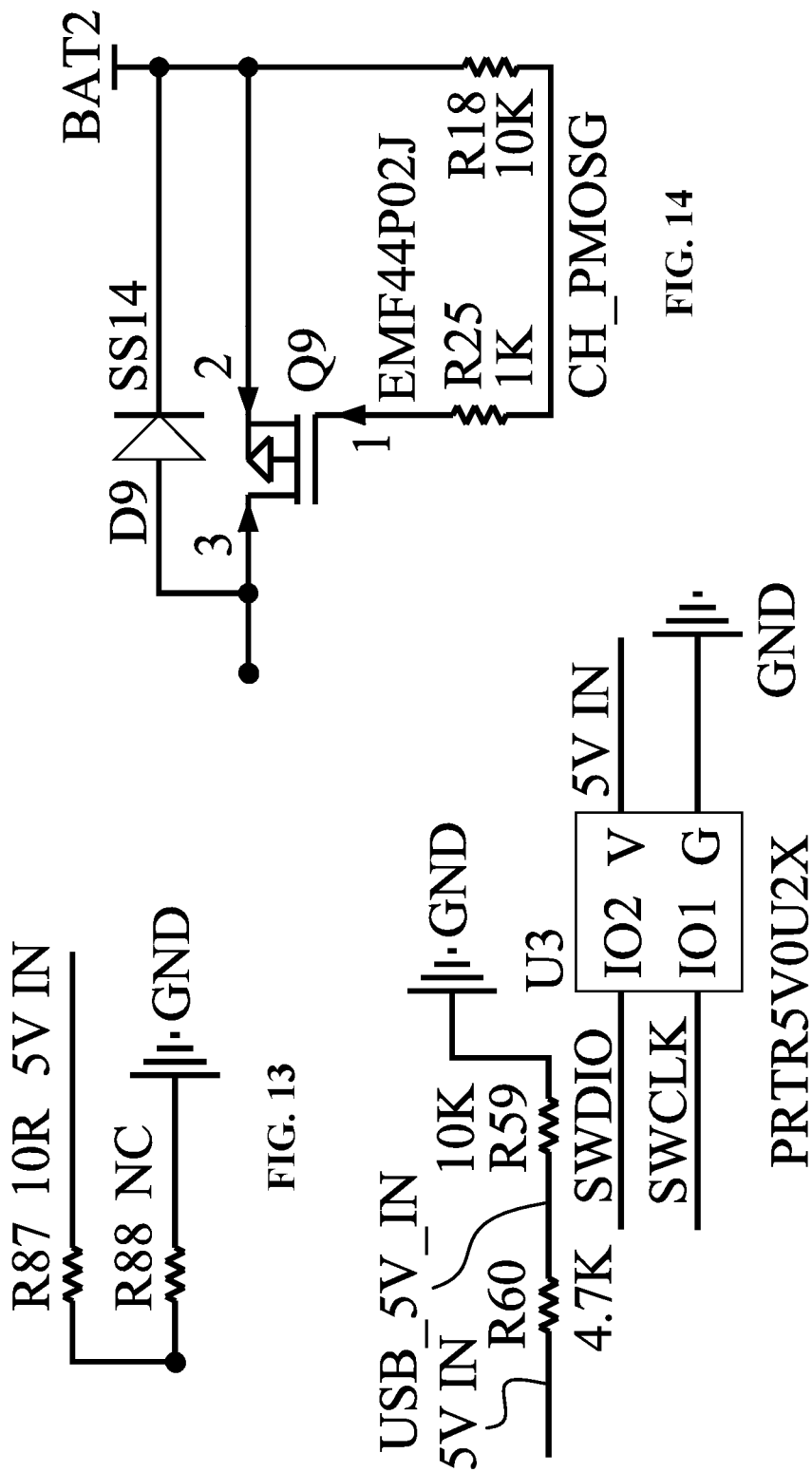

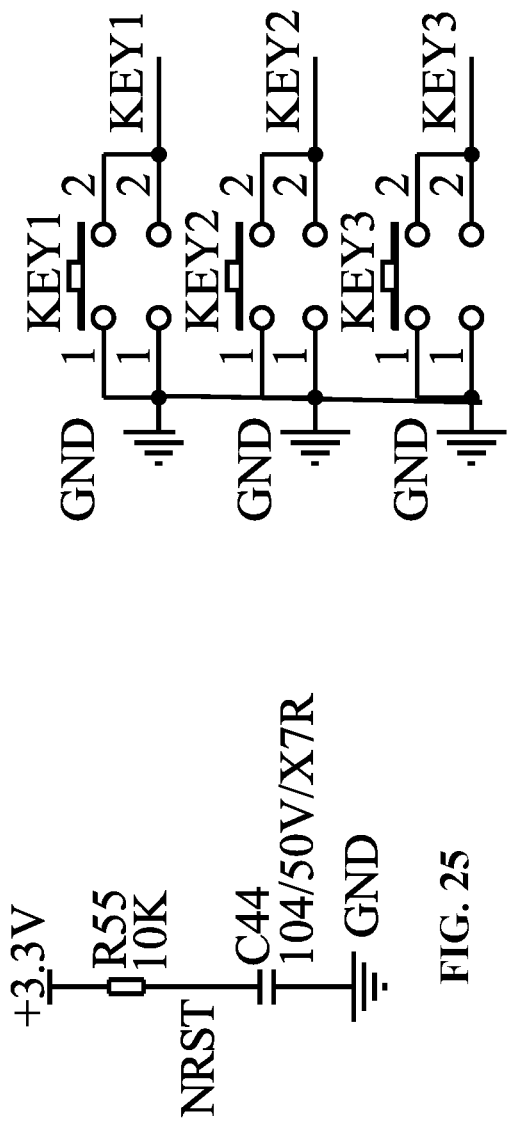
FIG. 26
FIG. 25
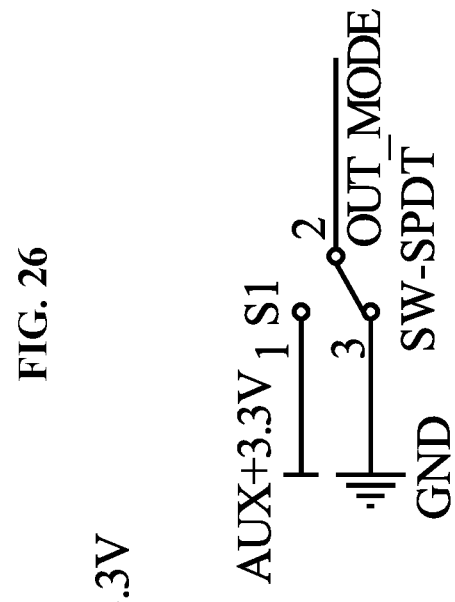
FIG. 28
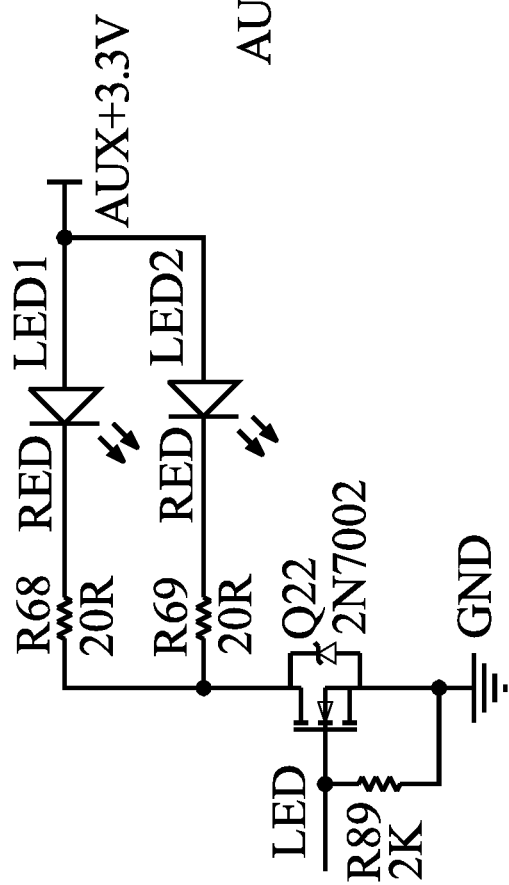
FIG. 27

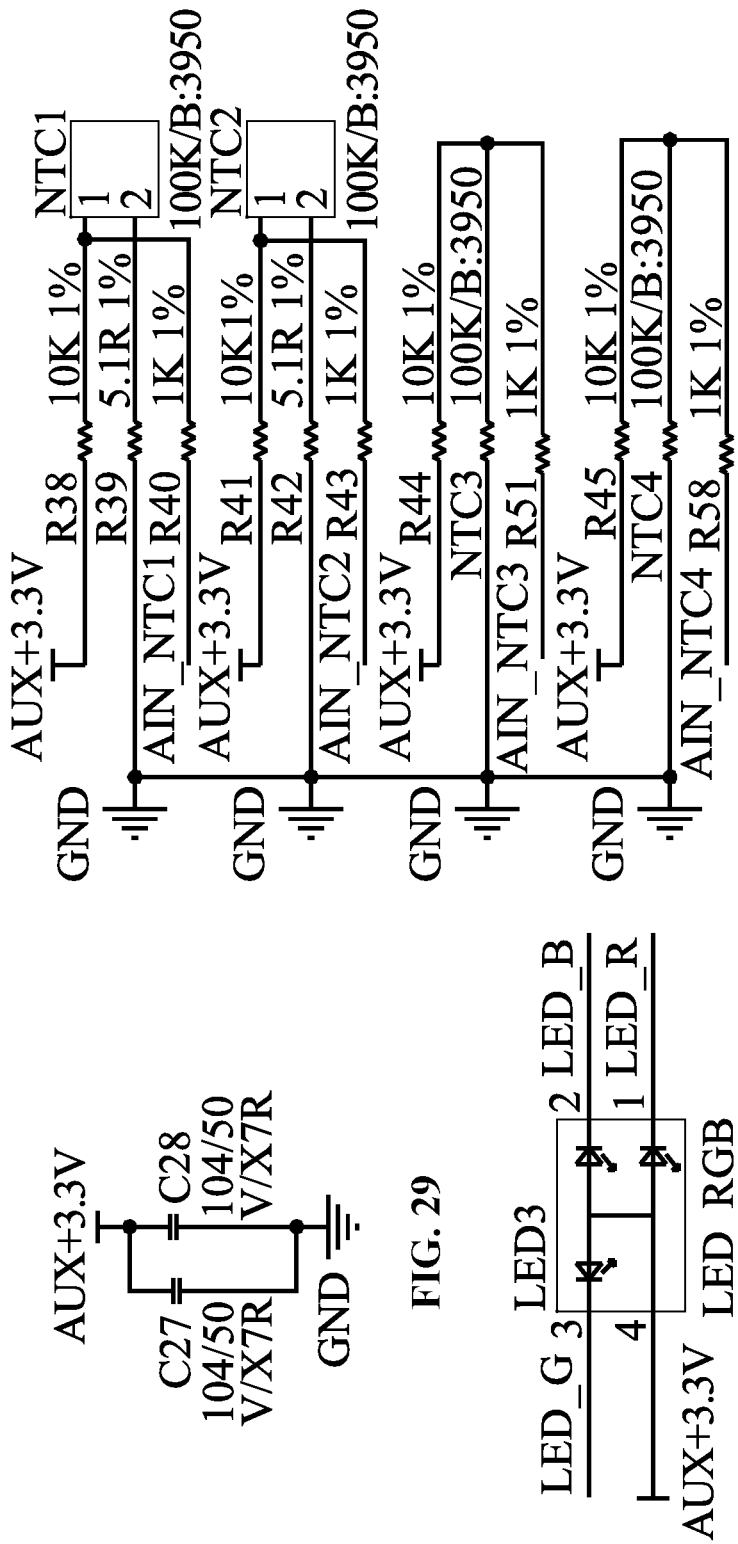

HIGH-FREQUENCY ELECTROMAGNETIC INDUCTION CONTROL CIRCUIT

CROSS-REFERENCE TO RELATED APPLICATIONS

Pursuant to 35 U.S.C. § 119 and the Paris Convention Treaty, this application claims foreign priority to Chinese Patent Application No. 202011250692.7 filed on Nov. 10, 2020, the contents of which, including any intervening amendments thereto, are incorporated herein by reference. Inquiries from the public to applicants or assignees concerning this document or the related applications should be directed to: Matthias Scholl P. C., Attn.: Dr. Matthias Scholl Esq., 245 First Street, 18th Floor, Cambridge, Mass. 02142.

BACKGROUND

The disclosure relates to a high-frequency electromagnetic induction control circuit.

Conventionally, a metal resistor is directly heated by current from a control circuit, without the use of an electromagnetic induction control circuit.

SUMMARY

The disclosure provides a high-frequency electromagnetic induction control circuit, comprising: a charging control circuit, a battery control and protection circuit, a battery, a main control MCU, a display control circuit, a keyboard control circuit, a drive circuit, a high-frequency heating circuit, and an induction heating circuit. The charging control circuit supplies a charging voltage and a charging current for the battery; the battery control and protection circuit is configured to detect whether the charging voltage and the charging current are qualified; the battery supplies power for the main control MCU; the main control MCU is configured to detect an input voltage of the battery, and the display control circuit sends out a signal whether the battery is in an under-voltage state; the keyboard control circuit is configured to control the main control MCU to operate; an output voltage of the main control MCU is boosted by the drive circuit; a boosted voltage is oscillated in the high-frequency heating circuit to produce an electromagnetic wave thus generating a high-frequency alternating voltage and current; the high-frequency alternating voltage and current is output to the induction heating circuit to produce an induced magnetic field and an eddy current is formed in a metal placed in the induction heating circuit, and the metal is heated through electromagnetic induction effect.

In a class of this embodiment, the charging control circuit is configured to convert a household 220V/23 A alternating current into a 5V/1 A DC charging voltage and charging current for the battery.

In a class of this embodiment, the battery control and protection circuit is configured to detect whether the charging voltage and charging current meet the voltage and current required by the battery, thus achieving the functions of over-current and over-voltage protection.

In a class of this embodiment, the battery comprises at least two cells connected in series or in parallel to supply power for the main control MCU and each circuit.

In a class of this embodiment, the main control MCU is configured to detect whether the battery is in the under-voltage state after the battery supplies power to the main control MCU; if so, the main control MCU feeds back the signal regarding to the under-voltage state to the display control circuit and the charging control circuit; the display control circuit sends out the signal, and the charging control circuit receives the signal and continues to charge the battery until the battery is fully charged.

In a class of this embodiment, the keyboard control circuit is configured to control the main control MCU to operate or stop operating, to switch a working mode and power of the main control MCU, to feed back information with regard to a working state, the working mode and power of the main control MCU to the display control circuit; and the display control circuit is configured to display the information.

In a class of this embodiment, the drive circuit is equivalent to a step-up transformer to increase the DC voltage from the battery.

In a class of this embodiment, the high-frequency heating circuit comprises a capacitor and an inductor; the high-frequency heating circuit is configured to oscillate the DC voltage output from the drive circuit to produce the electromagnetic wave, and to change positive and negative directions of the DC voltage periodically, thereby generating the high-frequency alternating voltage and current, and to output the high-frequency alternating voltage and current to the induction heating circuit.

In a class of this embodiment, the induction heating circuit comprises a metal coil and a metal container; the high-frequency alternating voltage and current pass through the metal coil to produce the induced magnetic field, and the metal container is heated in the induced magnetic field.

BRIEF DESCRIPTION OF THE DRAWINGS

FIG. 13 is a connection diagram of a circuit U1 in accordance with one embodiment of the disclosure;

FIG. 14 is a connection diagram of a circuit C18 in accordance with one embodiment of the disclosure;

FIG. 15 is a connection diagram of a circuit R87 in accordance with one embodiment of the disclosure;

FIG. 25 is a connection diagram of a circuit R81 in accordance with one embodiment of the disclosure;

FIG. 26 is a connection diagram of circuits P73, P74 and P75 in accordance with one embodiment of the disclosure;

FIG. 27 is a connection diagram of a circuit C28 in accordance with one embodiment of the disclosure;

FIG. 28 is a connection diagram of a circuit R38 in accordance with one embodiment of the disclosure;

FIG. 29 is a connection diagram of a circuit R70 in accordance with one embodiment of the disclosure;

FIG. 30 is a connection diagram of a circuit D10 in accordance with one embodiment of the disclosure;

FIG. 31 is a connection diagram of a circuit C45 in accordance with one embodiment of the disclosure;

DETAILED DESCRIPTION

To further illustrate, embodiments detailing a high-frequency electromagnetic induction control circuit are described below. It should be noted that the following embodiments are intended to describe and not to limit the disclosure.

Figure 1:
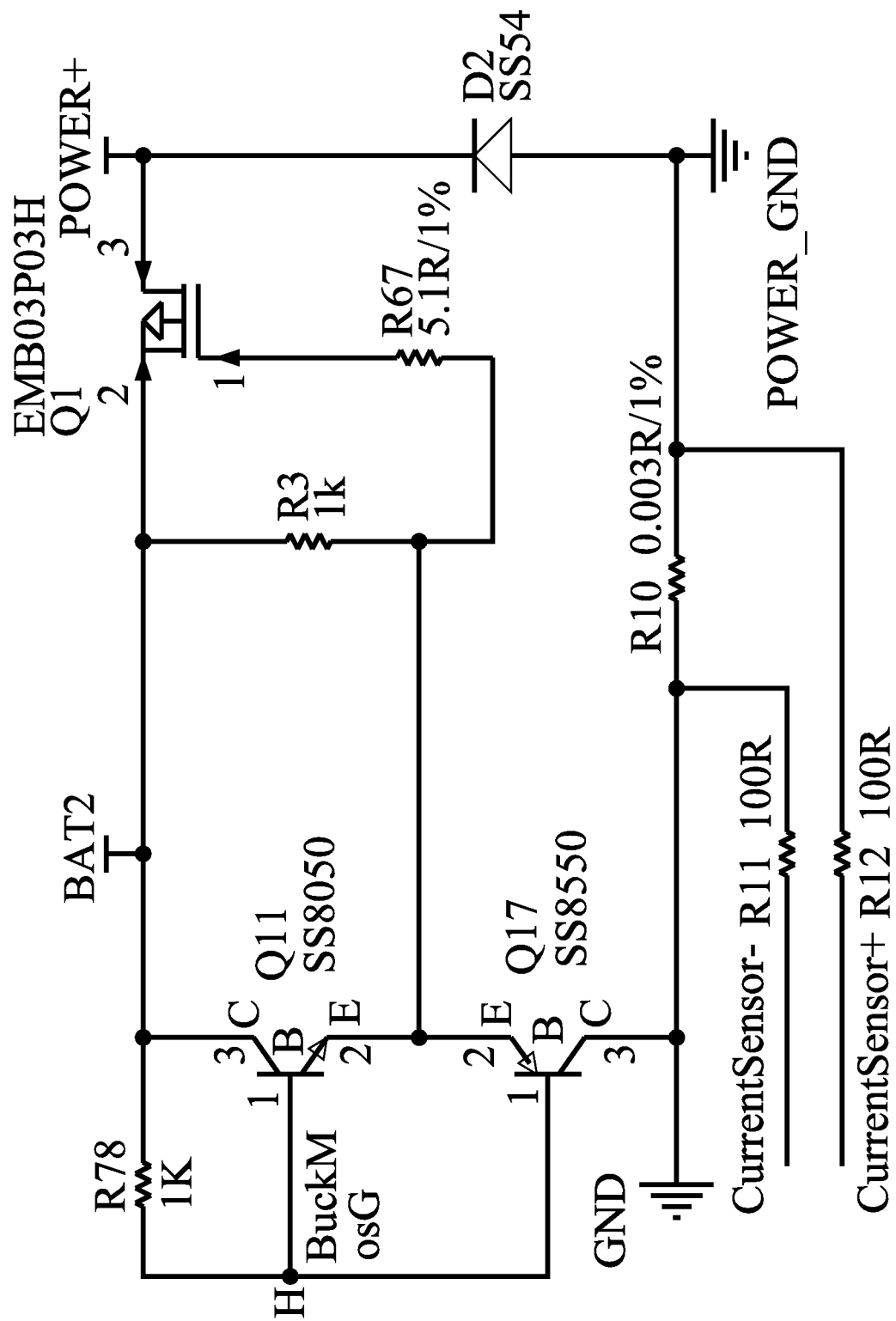
FIG. 1 is a connection diagram of a circuit L1 in accordance with one embodiment of the disclosure.
Figure 2:
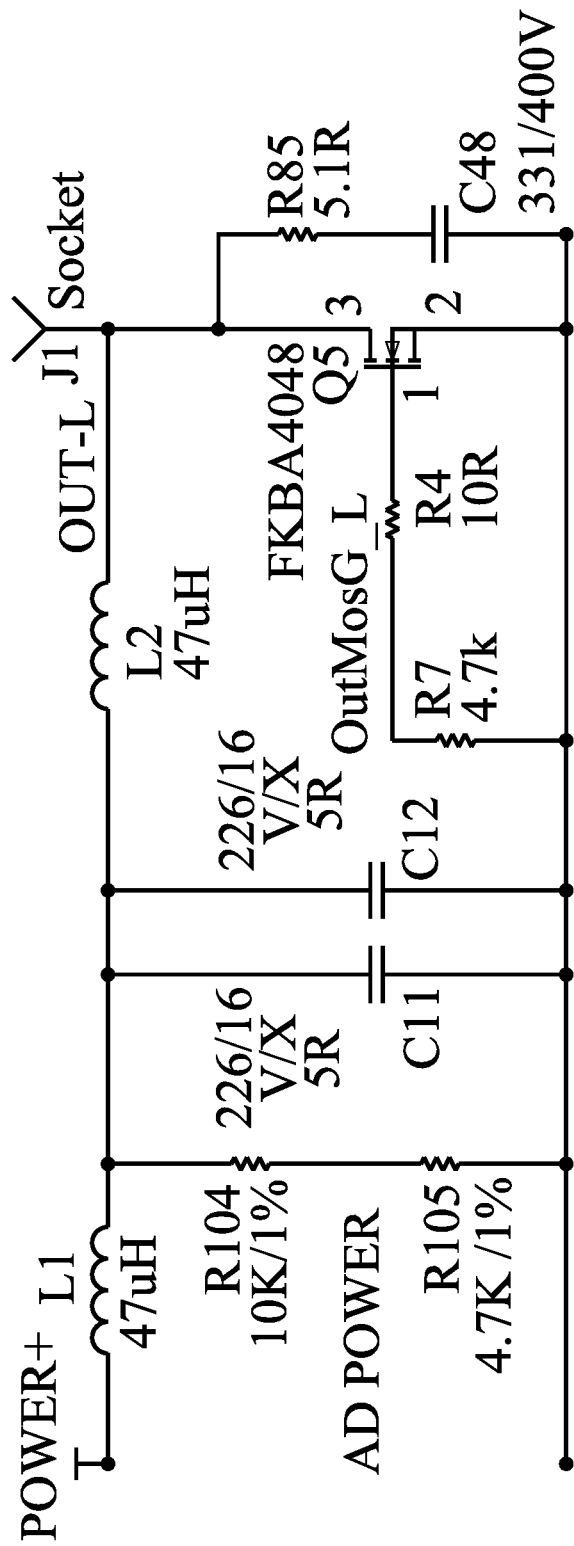
FIG. 2 is a connection diagram of a circuit D2 in accordance with one embodiment of the disclosure.
Figure 3:
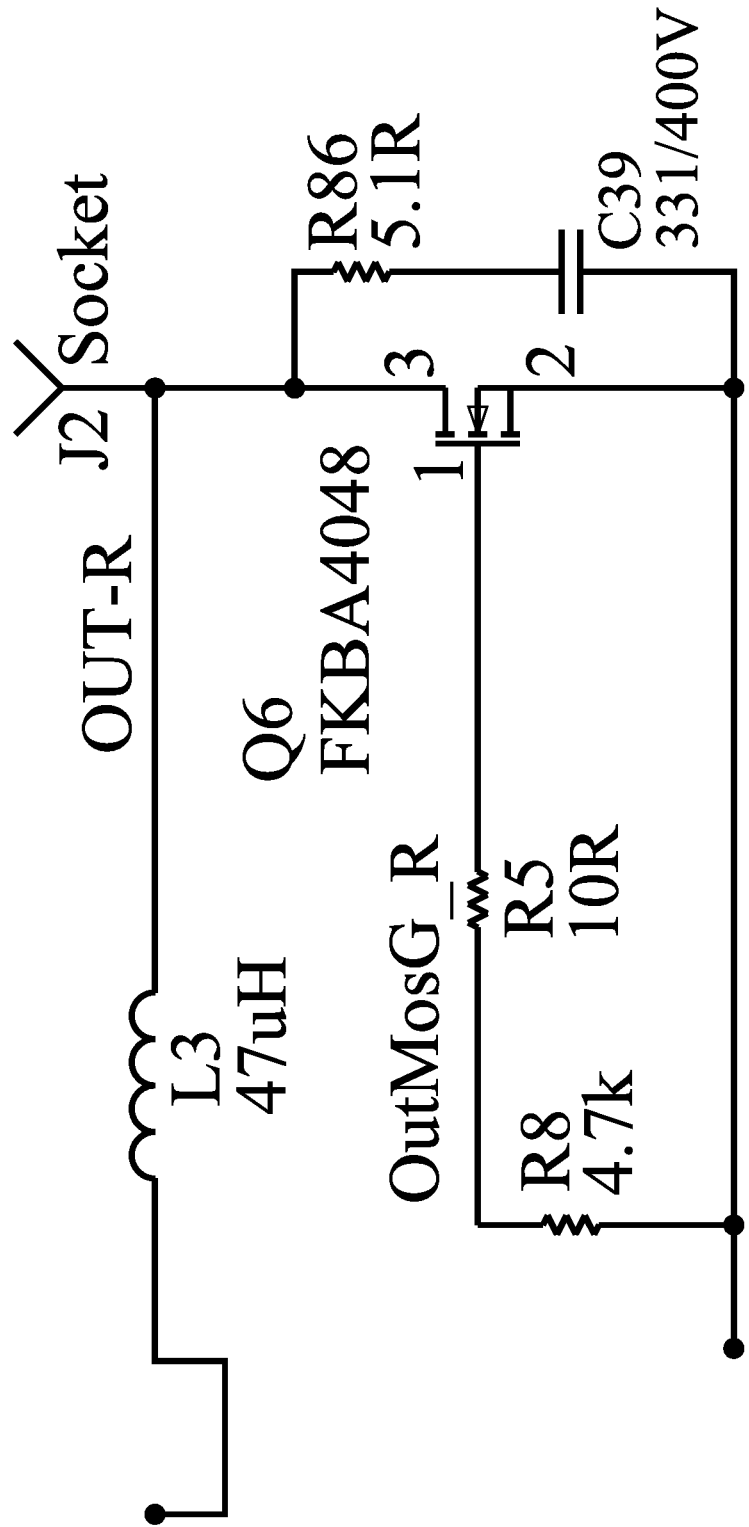
FIG. 3 is a connection diagram of a circuit L2 in accordance with one embodiment of the disclosure.
Figure 4:
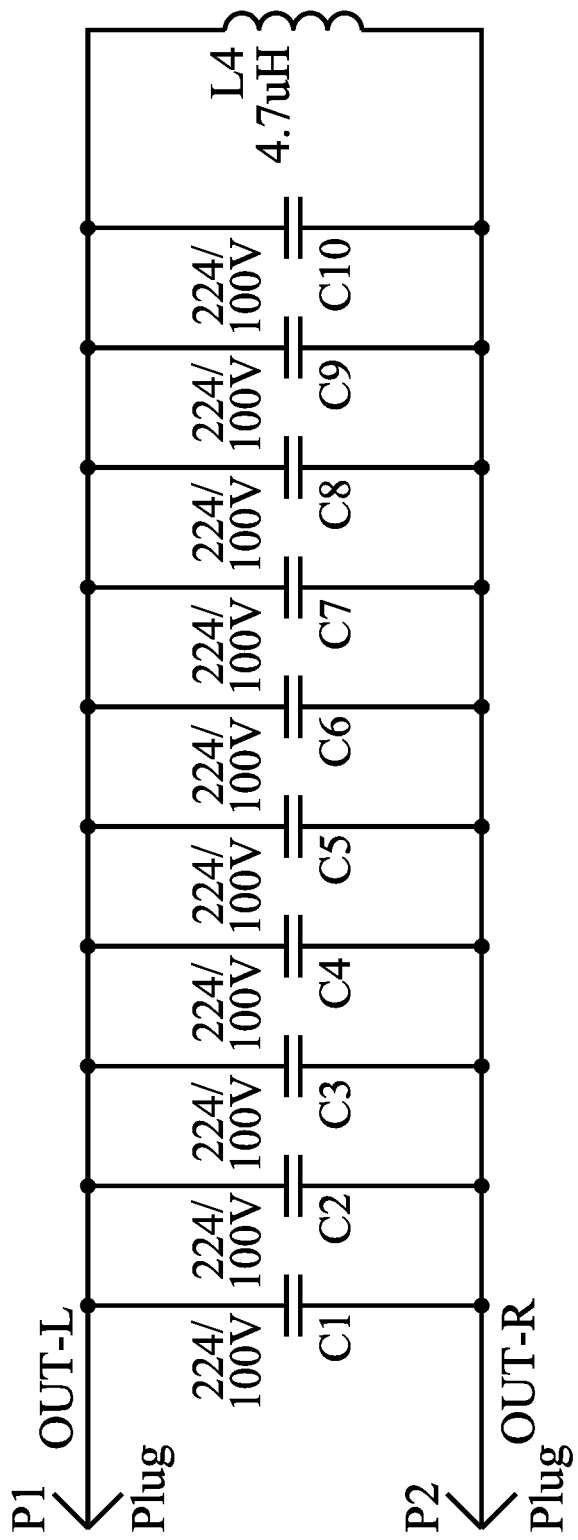
FIG. 4 is a connection diagram of a circuit J2 in accordance with one embodiment of the disclosure.
Figure 5:
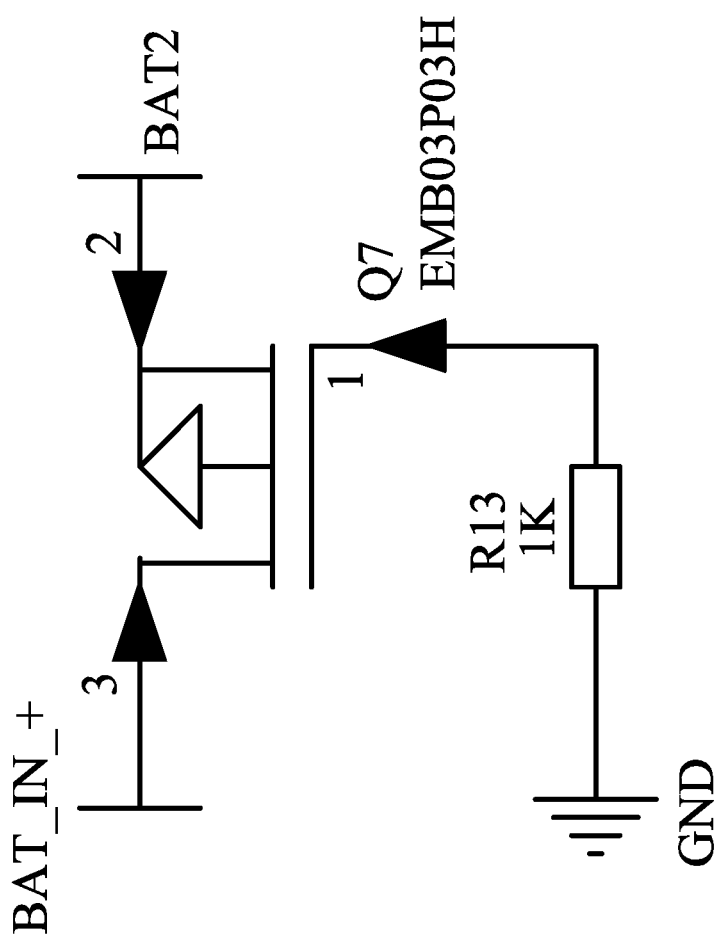
FIG. 5 is a connection diagram of a circuit Q9 in accordance with one embodiment of the disclosure.
Figure 6:
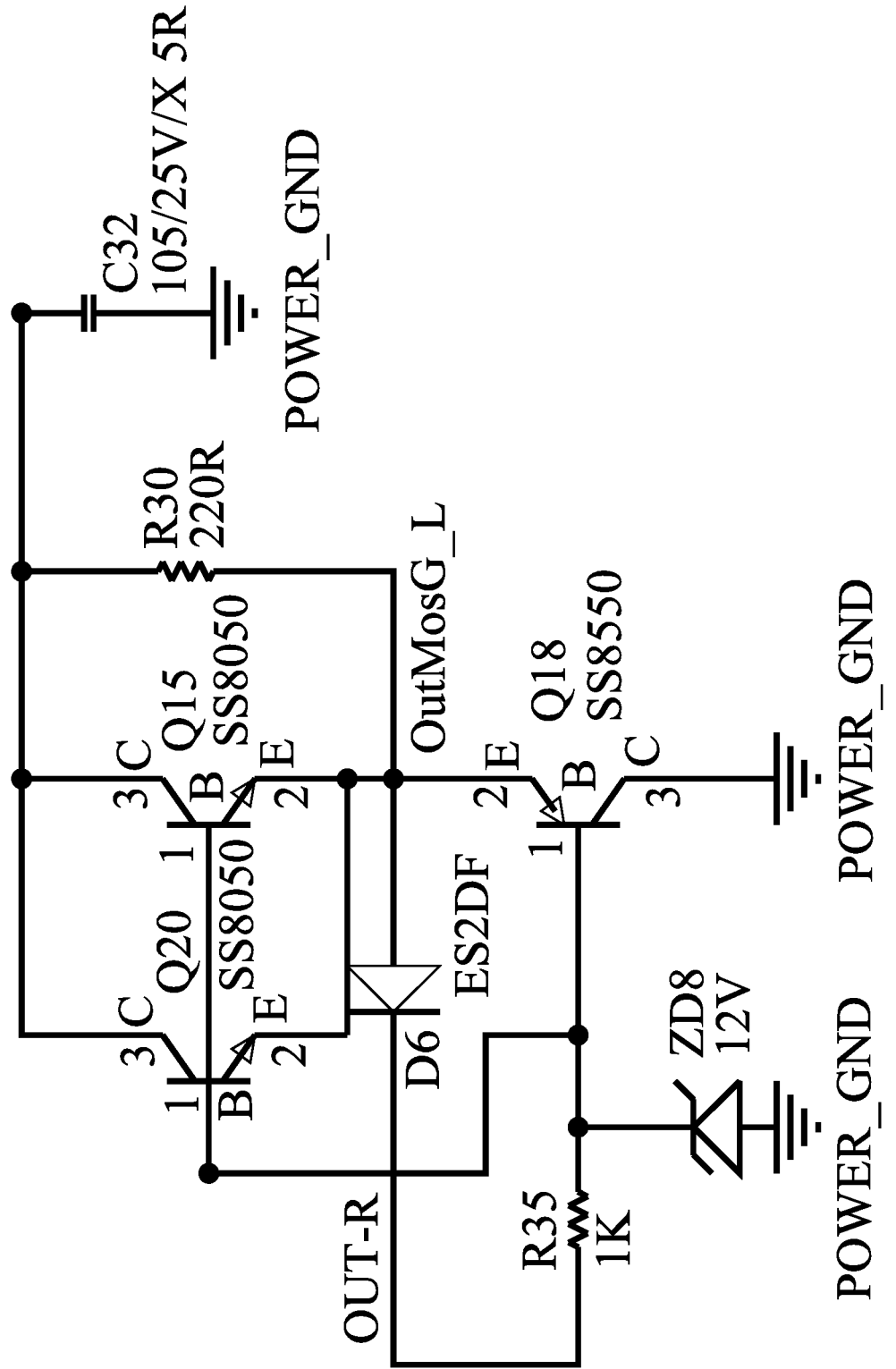
FIG. 6 is a connection diagram of a circuit Q16 in accordance with one embodiment of the disclosure.
Figure 7:
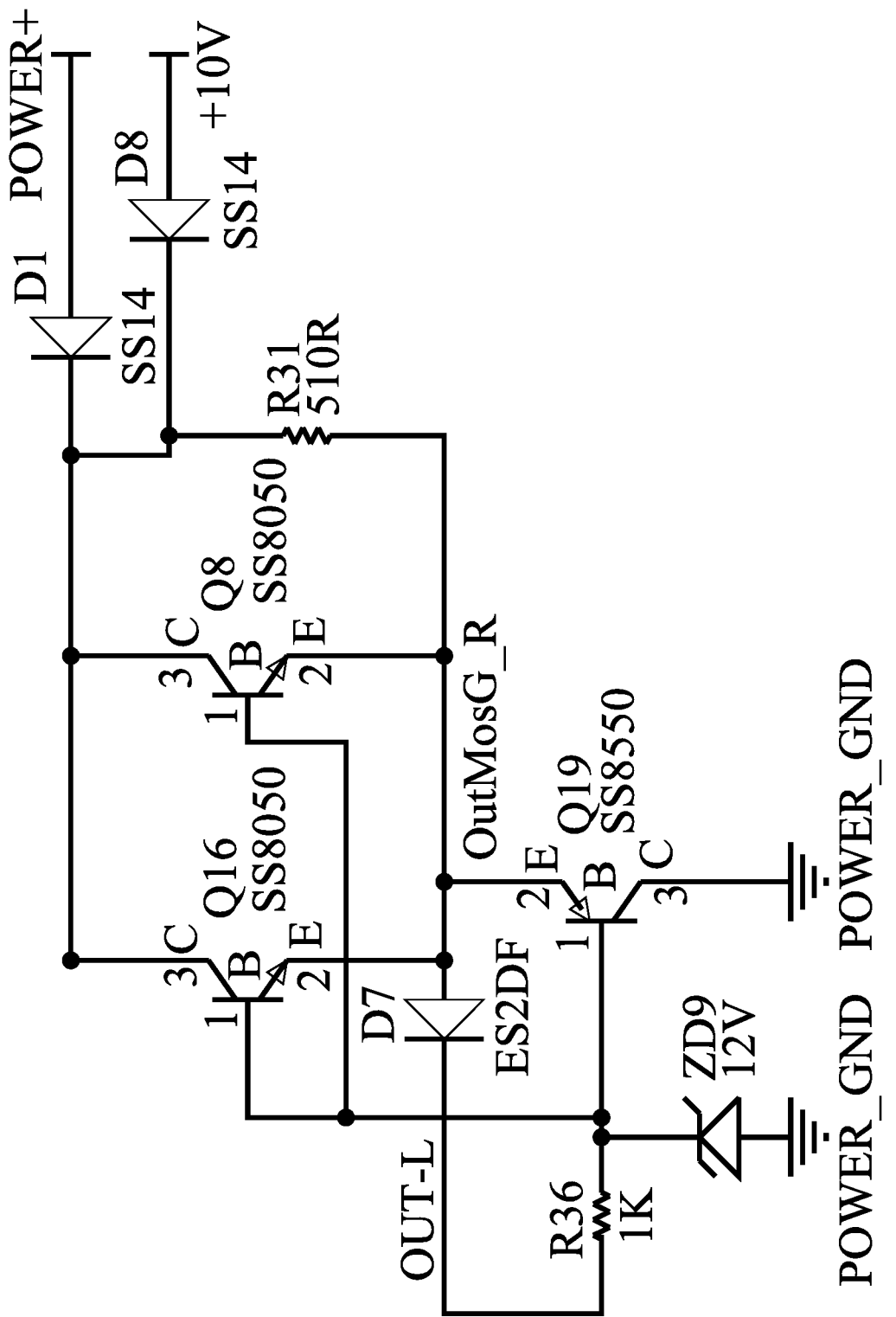
FIG. 7 is a connection diagram of a circuit C32 in accordance with one embodiment of the disclosure.
Figure 8:
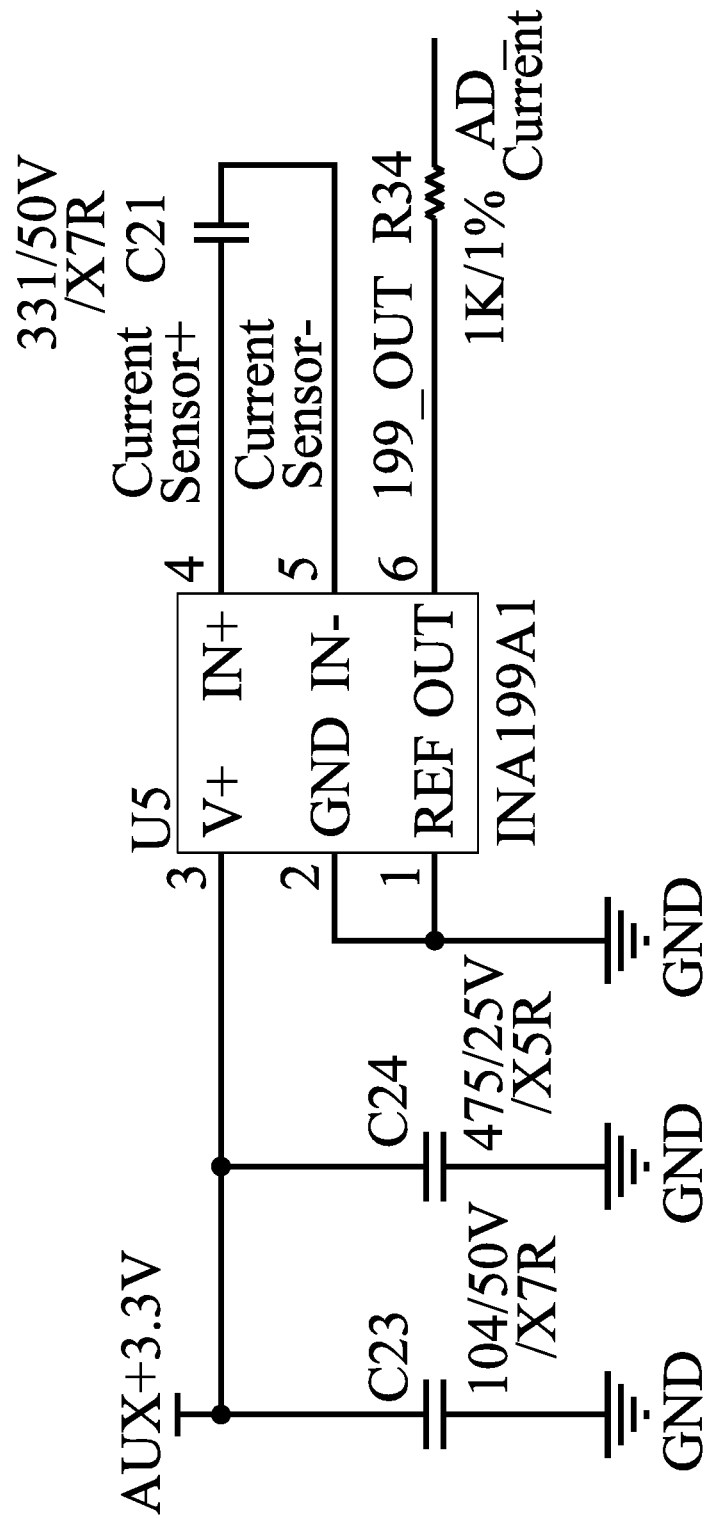
FIG. 8 is a connection diagram of a circuit C20 in accordance with one embodiment of the disclosure.
Figure 9:
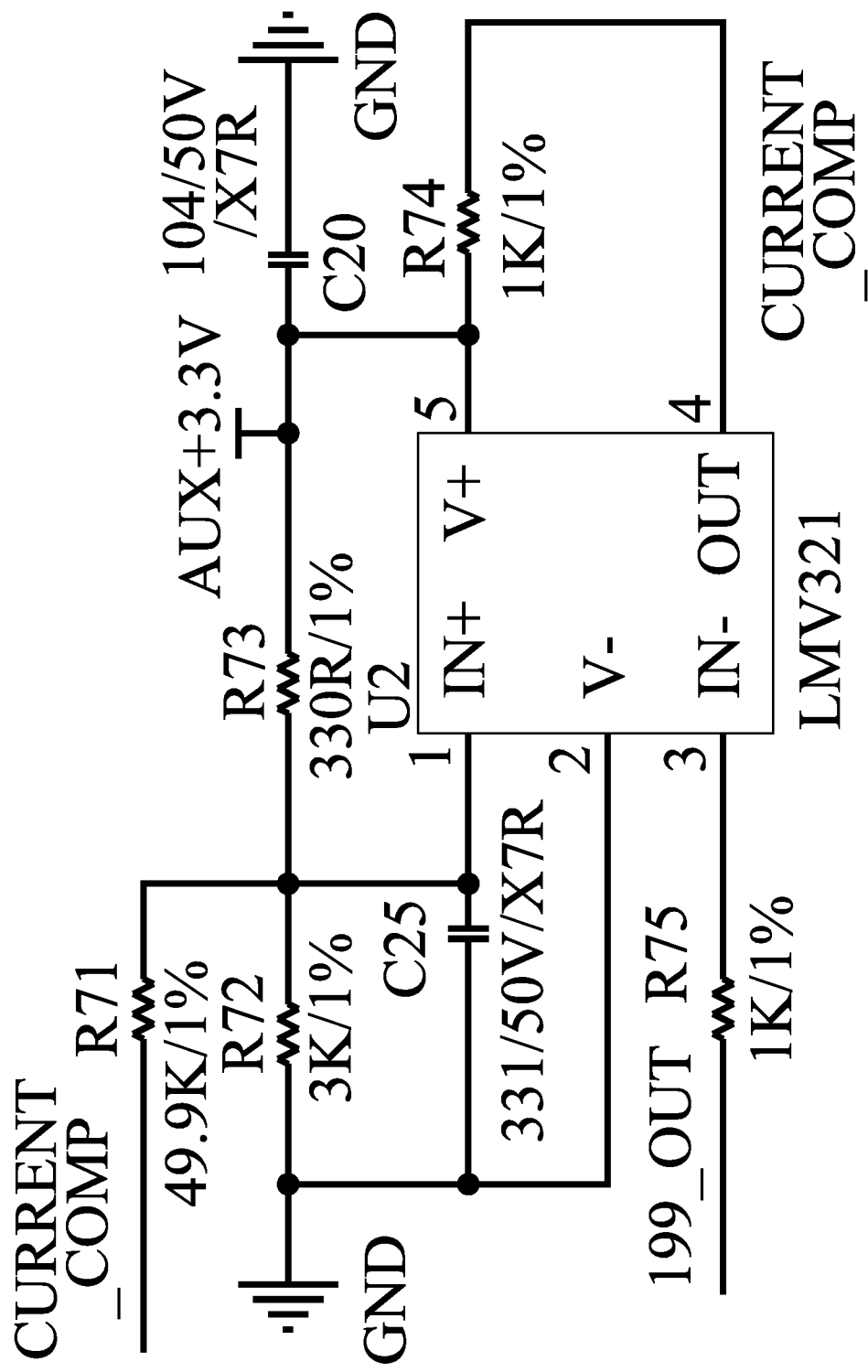
FIG. 9 is a connection diagram of a circuit C23 in accordance with one embodiment of the disclosure.
Figure 10:
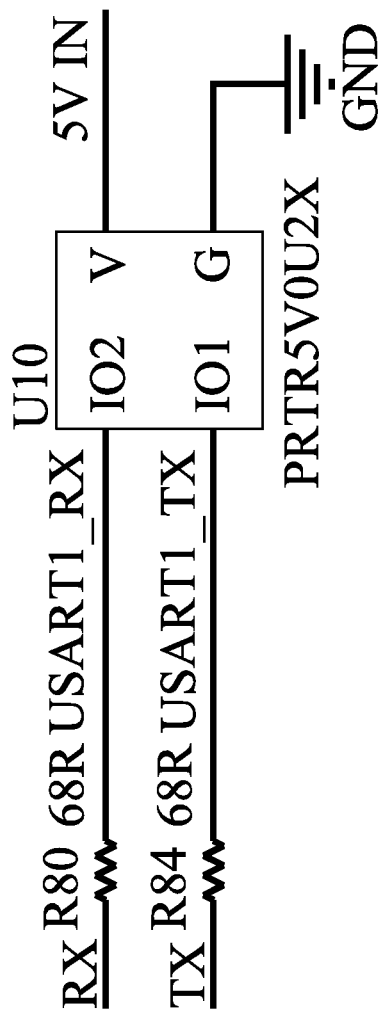
FIG. 10 is a connection diagram of a circuit R15 in accordance with one embodiment of the disclosure.
Figure 11:
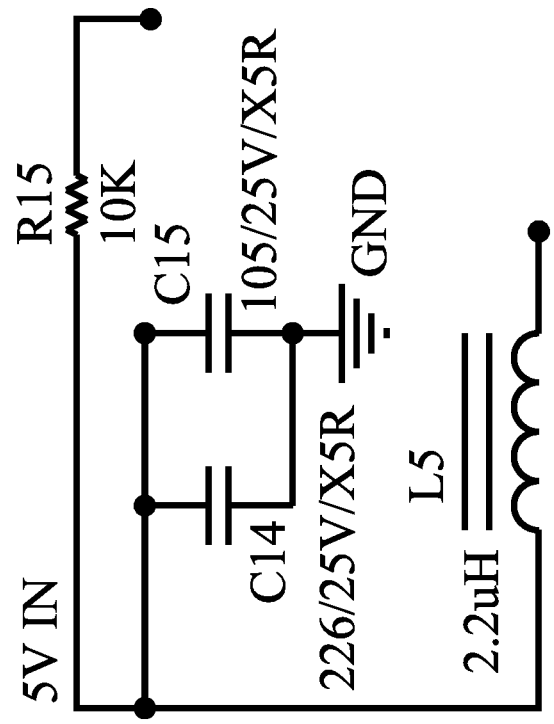
FIG. 11 is a connection diagram of a circuit C16 in accordance with one embodiment of the disclosure.
Figure 12:
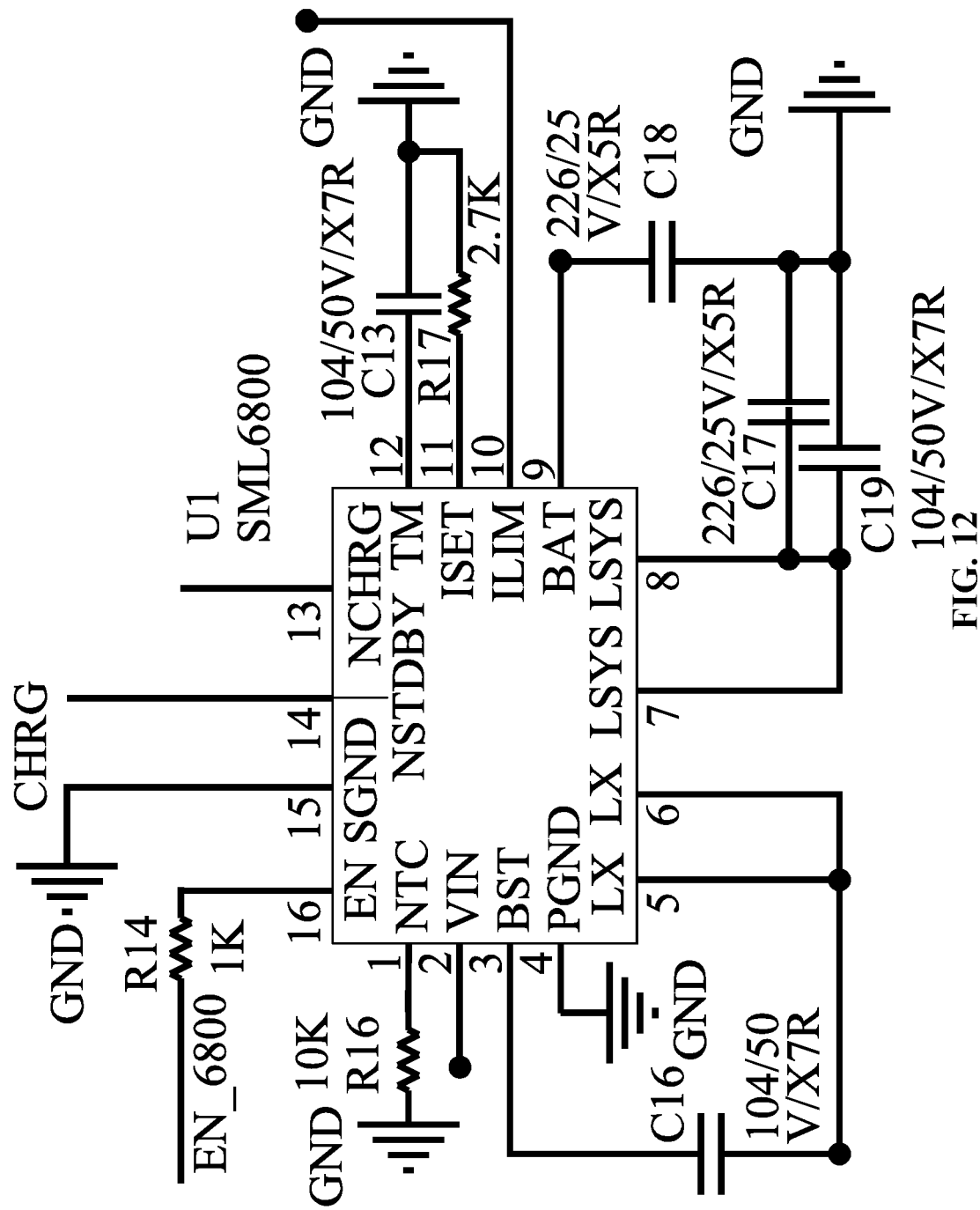
FIG. 12 is a connection diagram of a circuit L5 in accordance with one embodiment of the disclosure.
Figure 16:
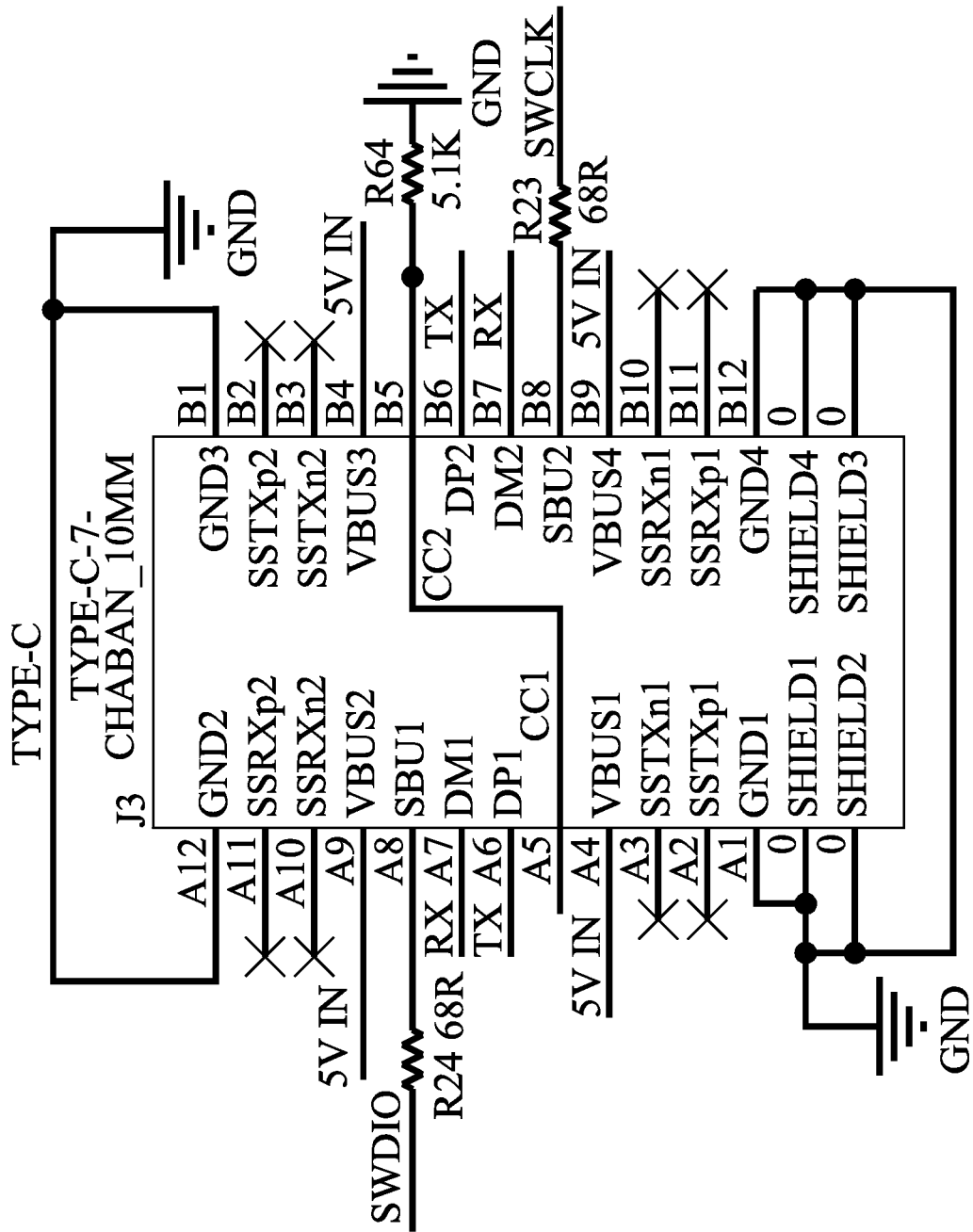
FIG. 16 is a connection diagram of a circuit U3 in accordance with one embodiment of the disclosure.
Figure 17:
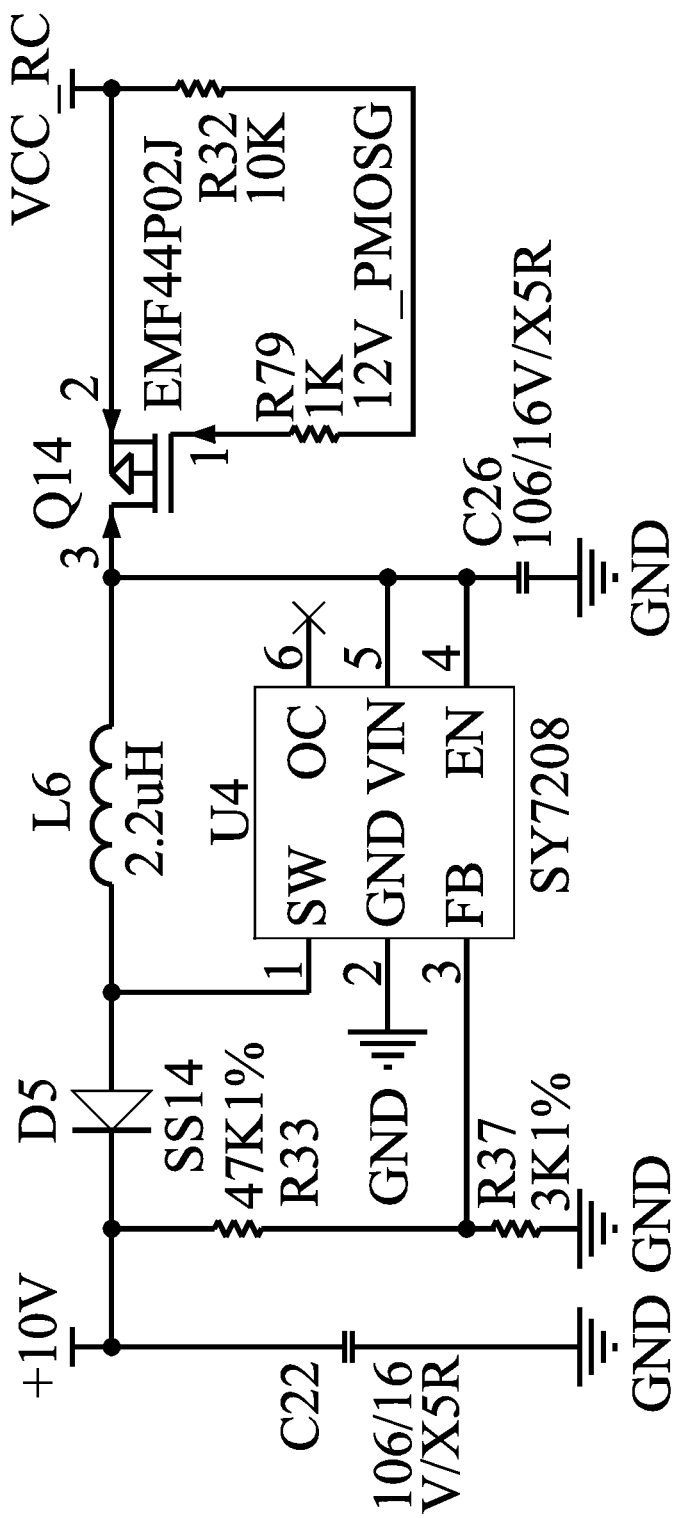
FIG. 17 is a connection diagram of a circuit D4 in accordance with one embodiment of the disclosure.
Figure 18:
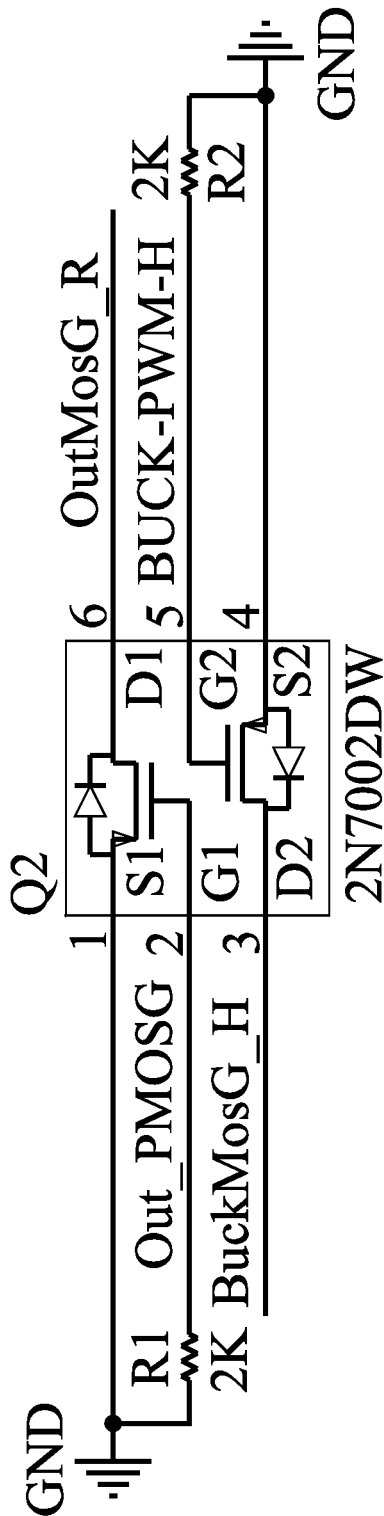
FIG. 18 is a connection diagram of a circuit R48 in accordance with one embodiment of the disclosure.
Figure 19:
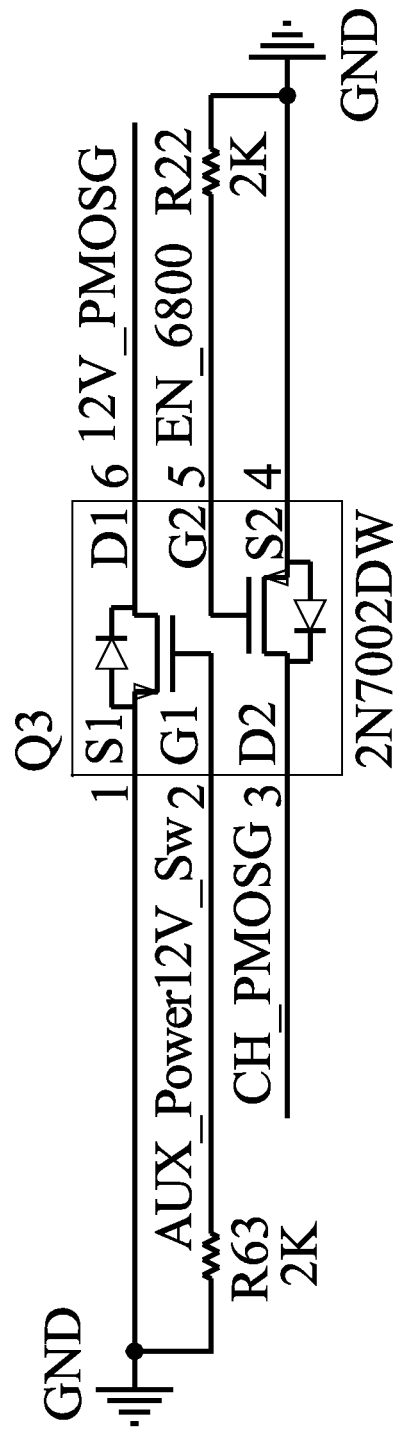
FIG. 19 is a connection diagram of a circuit U8 in accordance with one embodiment of the disclosure.
Figure 20:
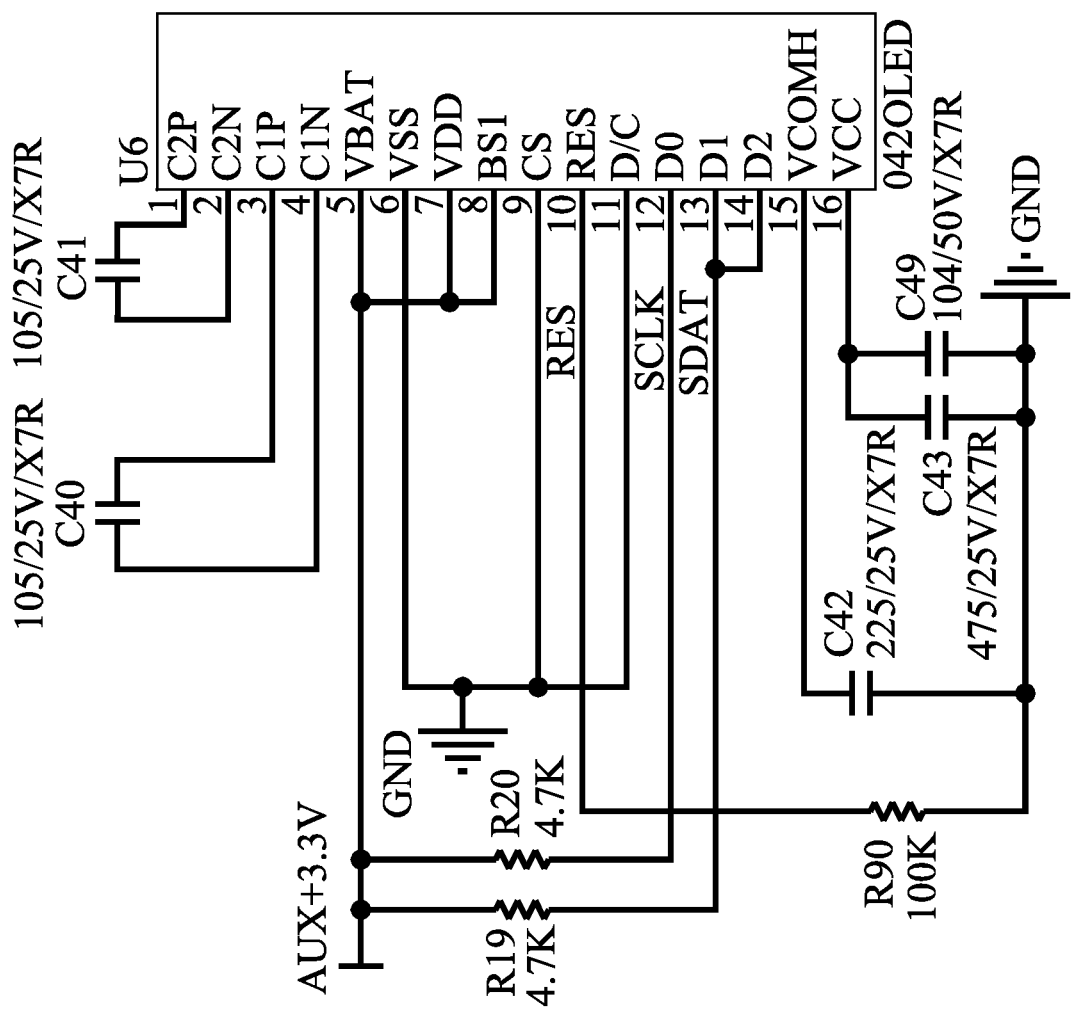
FIG. 20 is a connection diagram of a circuit R73 in accordance with one embodiment of the disclosure.
Figure 21:
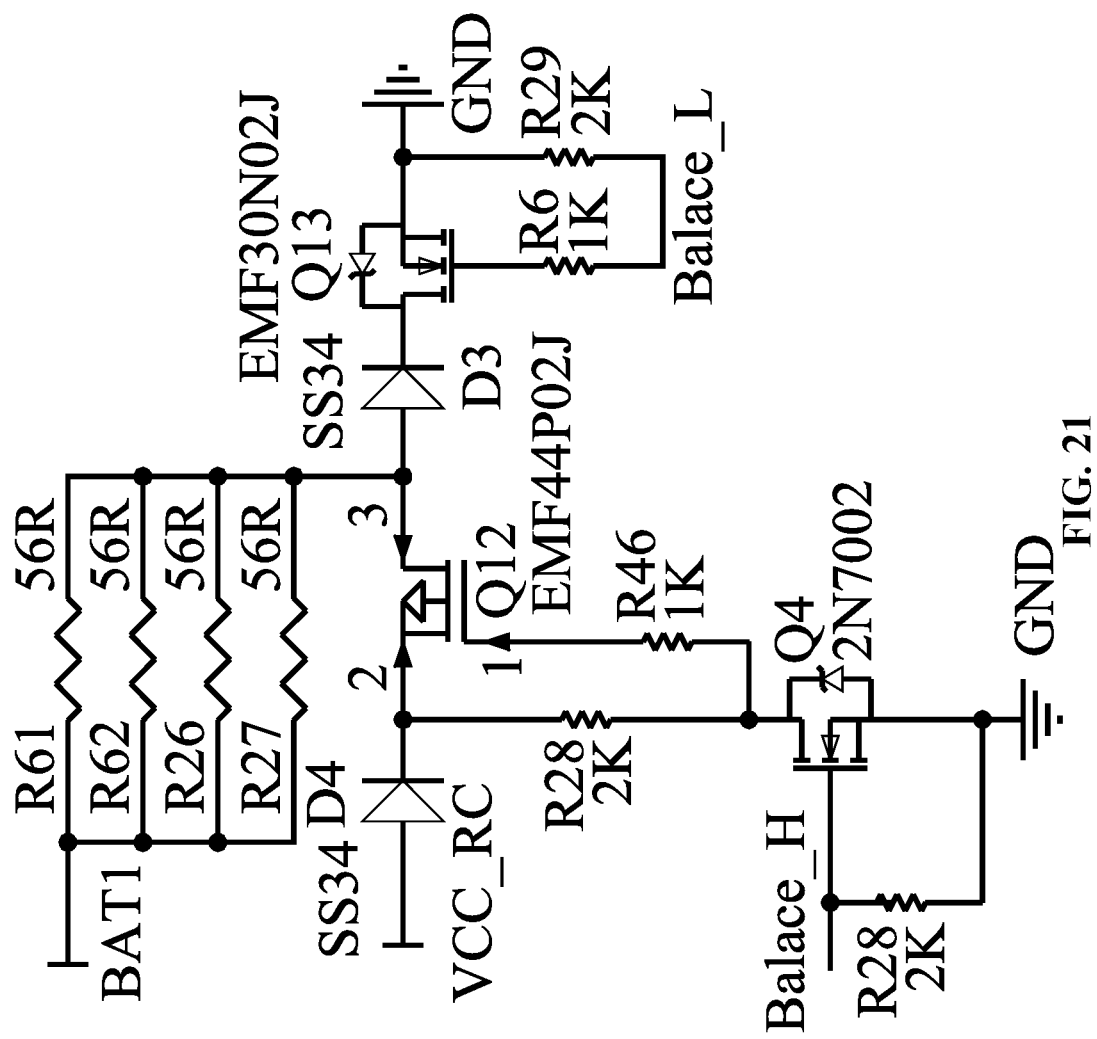
FIG. 21 is a connection diagram of a circuit U2 in accordance with one embodiment of the disclosure.
Figure 22:
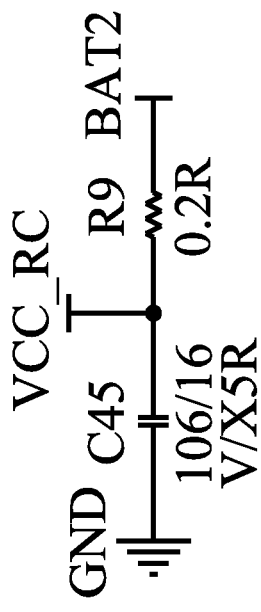
FIG. 22 is a connection diagram of a circuit D10 in accordance with one embodiment of the disclosure.
Figure 23:
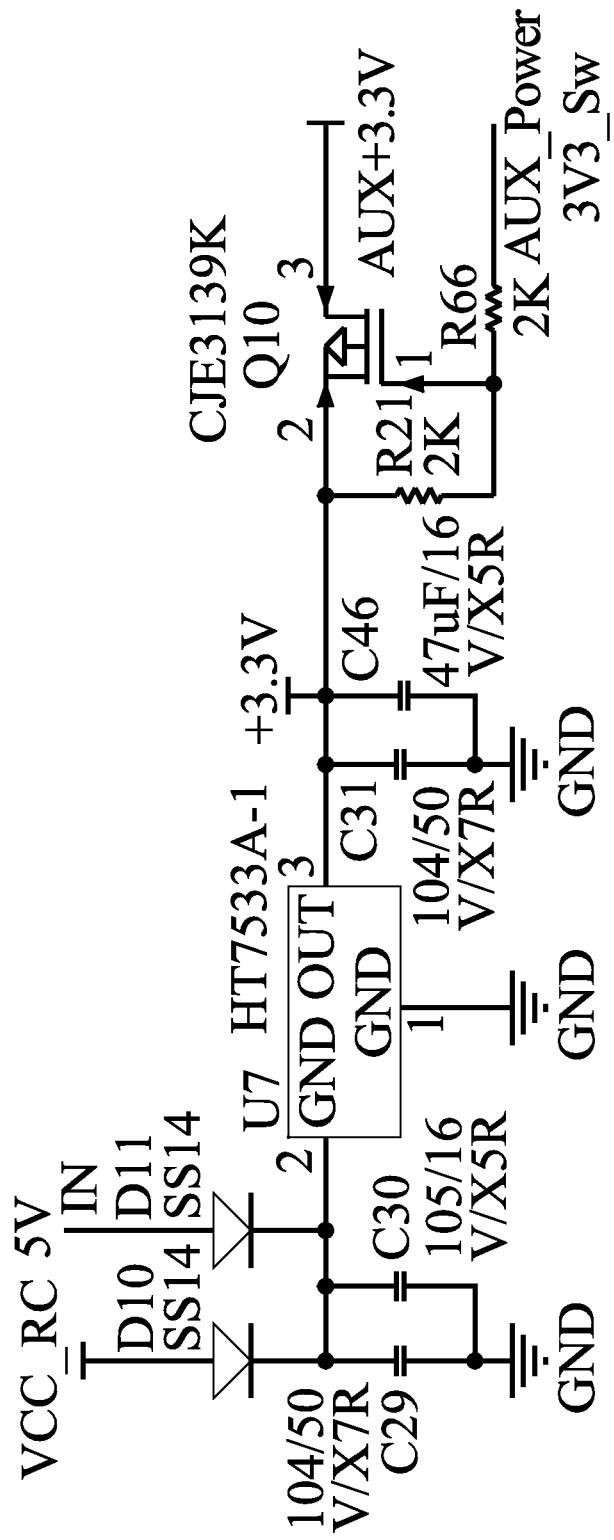
FIG. 23 is a connection diagram of a circuit R9 in accordance with one embodiment of the disclosure.
Figure 24:
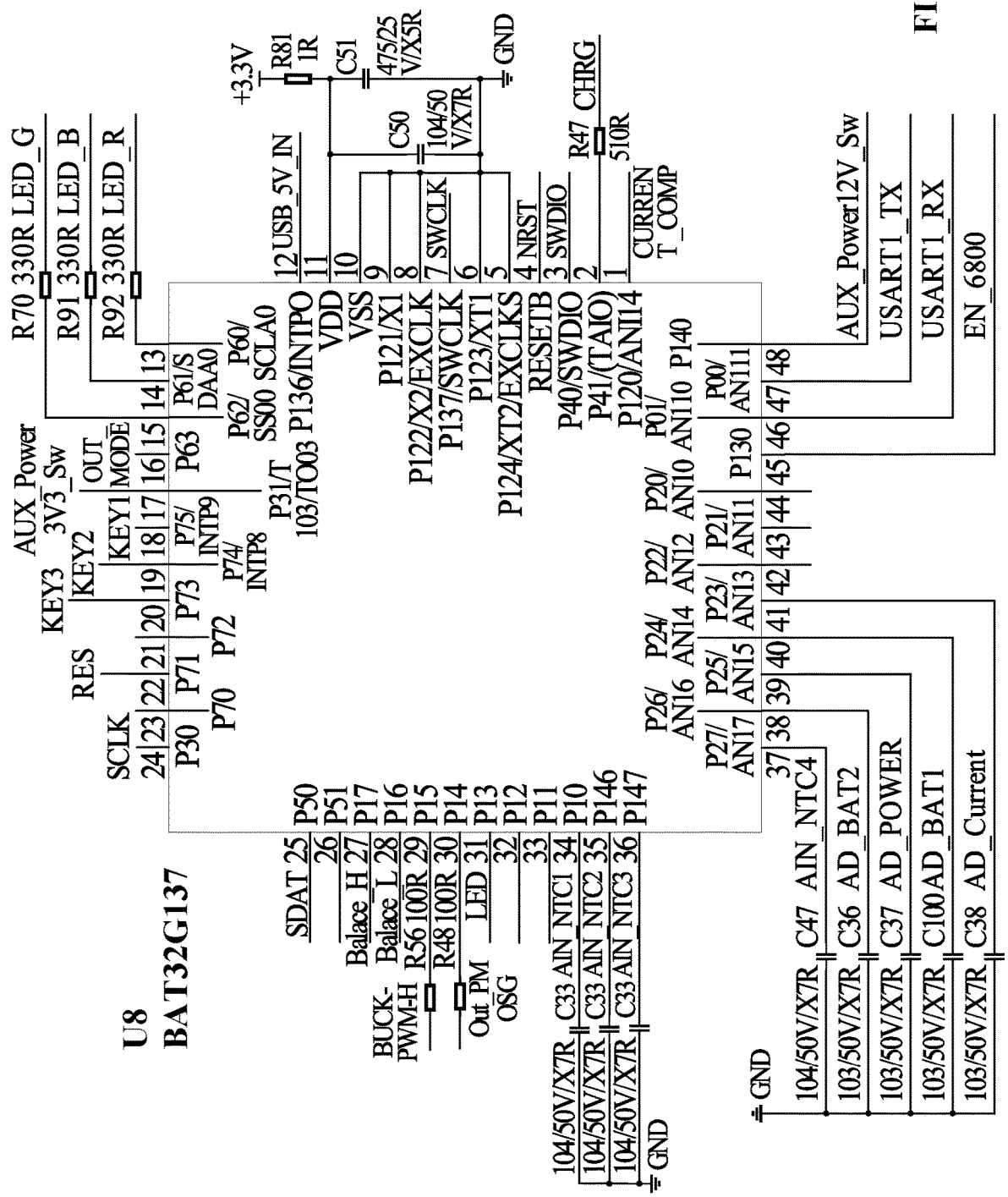
FIG. 24 is a connection diagram of a circuit R55 in accordance with one embodiment of the disclosure.
Figure 32:
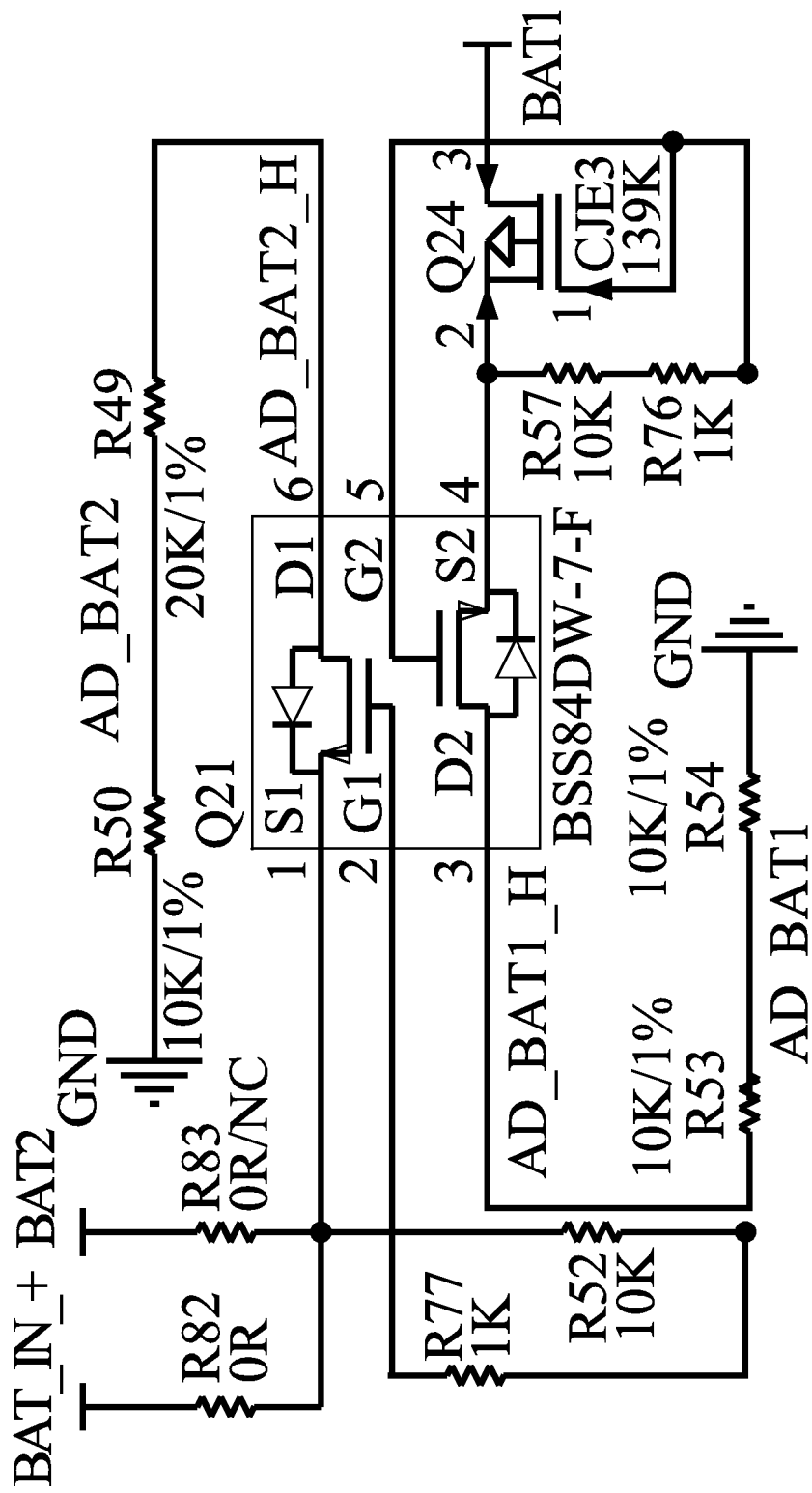
FIG. 32 is a connection diagram of a circuit Q23 in accordance with one embodiment of the disclosure.
Figure 33:
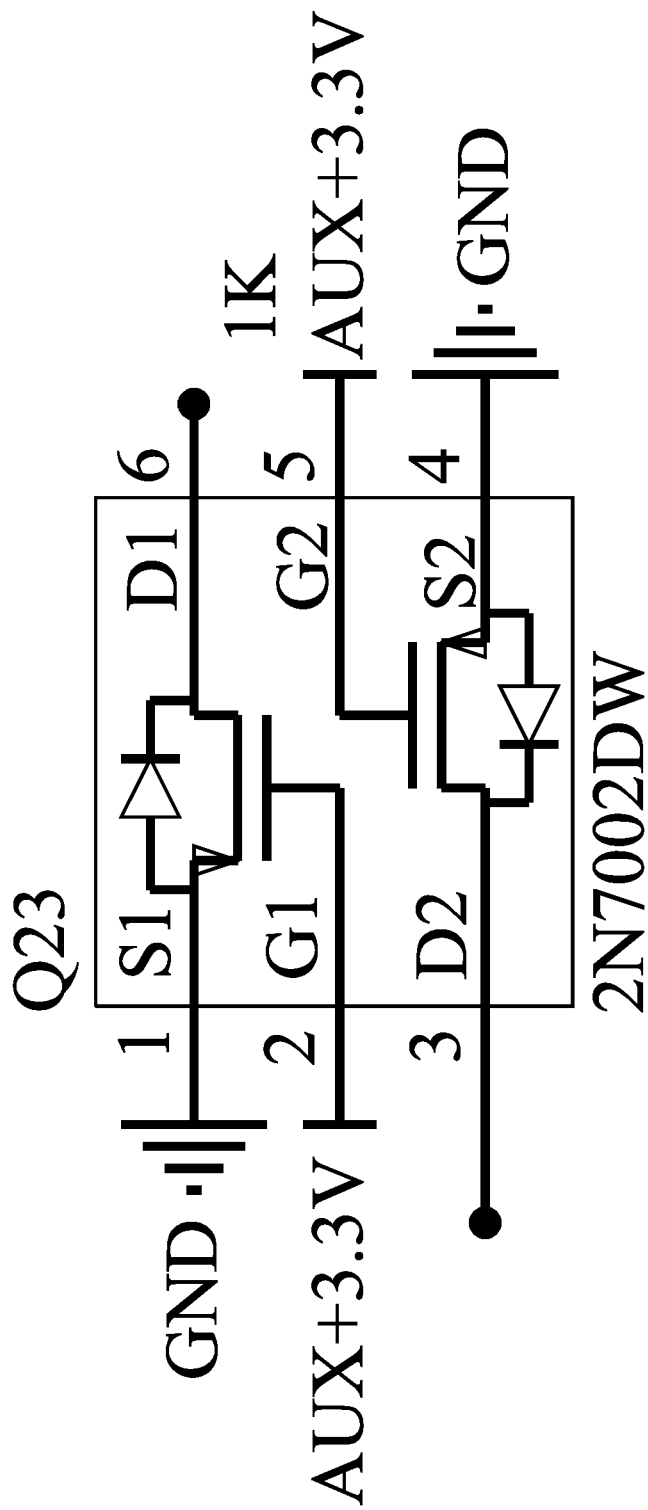
FIG. 33 is a connection diagram of a circuit Q21 in accordance with one embodiment of the disclosure.
Figure 34:
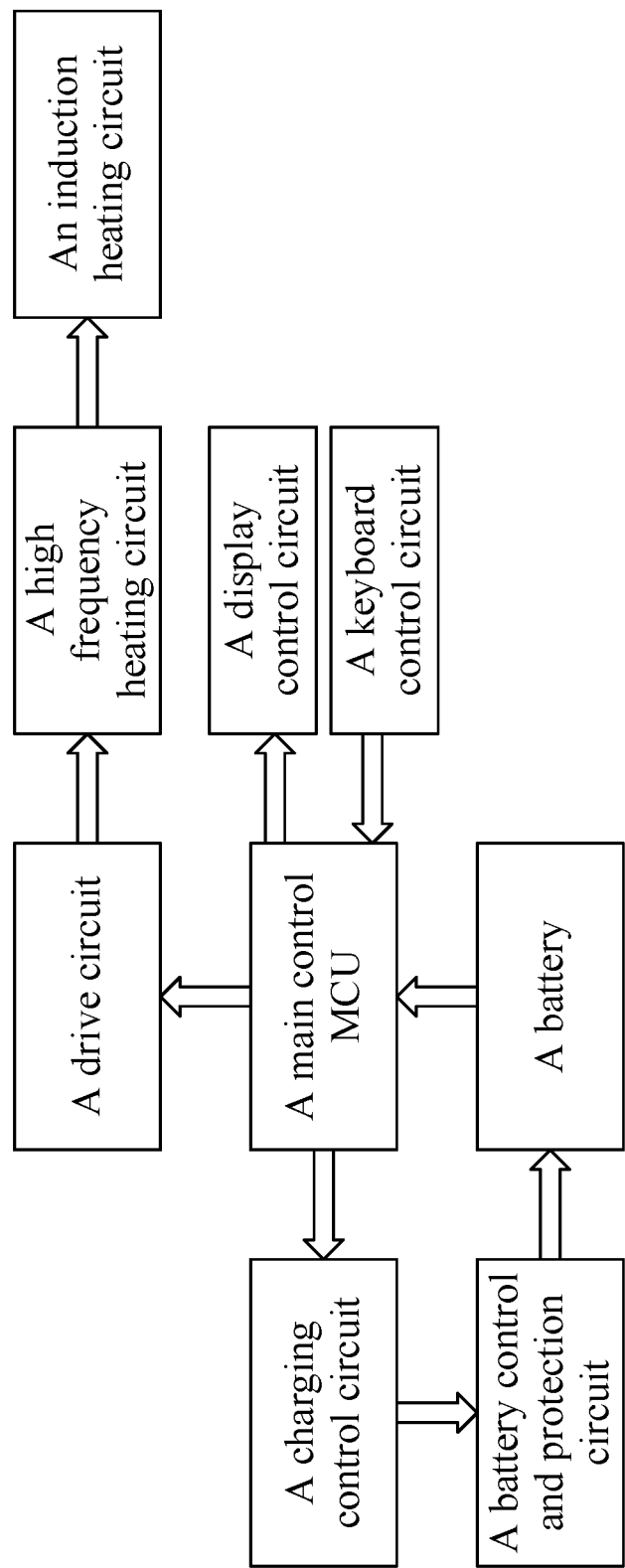
FIG. 34 is a schematic diagram of high-frequency electromagnetic induction control circuit in accordance with one embodiment of the disclosure.

As shown in FIGS. 1-34, the disclosure provides a high-frequency electromagnetic induction control circuit comprising a charging control circuit, a battery, a main control MCU, a display control circuit, a drive circuit, a high-frequency heating circuit, and an induction heating circuit. The charging control circuit supplies a charging voltage and a charging current for the battery. The main control MCU detects the input voltage of the battery, and the display control circuit sends out a signal whether the battery is in the under-voltage state. If not, the main control MCU feeds back the signal to the battery. Thereafter, the input voltage of the battery is boosted by the drive circuit. The boosted voltage is oscillated in the high-frequency heating circuit to produce an electromagnetic wave thus generating high-frequency alternating voltage and current. The high-frequency alternating voltage and current is output to the induction heating circuit to produce an induced magnetic field and an eddy current. The object in the induction heating circuit produces an electromagnetic induction effect and then is heated, achieving the conversion from electromagnetic energy to heat energy.

In certain embodiments, the charging control circuit is configured to convert the household 220V/23 A alternating current into the 5V/1 A DC charging voltage and charging current for the battery. The battery adopts two 18650 cells connected in series, and each 3.7V. Under full power, 8.4V voltage can be input to supply power to the main control MCU and each circuit.

In certain embodiments, the main control MCU is configured to detect whether the battery is in the under-voltage state after the battery supplies power to the main control MCU. If so, the main control MCU feeds back the signal regarding to the under-voltage state to the display control circuit and the charging control circuit. The display control circuit sends out the signal, and the charging control circuit receives the signal and continues to charge the battery until the battery is fully charged.

In certain embodiments, the drive circuit is equivalent to a step-up transformer to increase the DC voltage from the battery.

In certain embodiments, the high-frequency heating circuit comprises a capacitor and an inductor; the high-frequency heating circuit is configured to oscillate the DC voltage output from the drive circuit to produce the electromagnetic wave, and to change positive and negative directions of the DC voltage periodically, thereby generating the high-frequency alternating voltage and current, and to output the high-frequency alternating voltage and current to the induction heating circuit.

In certain embodiments, the high-frequency alternating voltage and current is output to the induction heating circuit to produce the induced magnetic field and the eddy current. A conductor in the induction heating circuit produces an electromagnetic induction effect and then is heated, achieving the conversion from electromagnetic energy to heat energy.

It will be obvious to those skilled in the art that changes and modifications may be made, and therefore, the aim in the appended claims is to cover all such changes and modifications.

What is claimed is:

1. A high-frequency electromagnetic induction control circuit, comprising:
   a charging control circuit;
   a battery control and protection circuit;
   a battery;
   a main control MCU;
   a display control circuit;
   a keyboard control circuit;
   a drive circuit;
   a high-frequency heating circuit; and
   an induction heating circuit;
   wherein
   the charging control circuit supplies a charging voltage and a charging current for the battery;
   the battery control and protection circuit is configured to detect whether the charging voltage and the charging current are qualified;
   the battery supplies power for the main control MCU;
   the main control MCU is configured to detect an input voltage of the battery, and the display control circuit sends out a signal whether the battery is in an under-voltage state;
   the keyboard control circuit is configured to control the main control MCU to operate;
   an output voltage of the main control MCU is boosted by the drive circuit; a boosted voltage is oscillated in the high-frequency heating circuit to produce an electromagnetic wave thus generating a high-frequency alternating voltage and current; the high-frequency alternating voltage and current is output to the induction heating circuit to produce an induced magnetic field and an eddy current is formed in a metal placed in the induction heating circuit, and the metal is heated through electromagnetic induction effect.

2. The high-frequency electromagnetic induction control circuit of claim 1, wherein the charging control circuit is configured to convert a household 220V/23 A alternating current into a 5V/1 A DC charging voltage and charging current for the battery.

3. The high-frequency electromagnetic induction control circuit of claim 2, wherein the battery control and protection circuit is configured to detect whether the charging voltage and charging current meet a voltage and a current required by the battery, thus achieving the functions of over-current and over-voltage protection.

4. The high-frequency electromagnetic induction control circuit of claim 1, wherein the battery comprises at least two cells connected in series or in parallel to supply power for the main control MCU and each circuit.

5. The high-frequency electromagnetic induction control circuit of claim 1, wherein the main control MCU is configured to detect whether the battery is in the under-voltage state after the battery supplies power to the main control MCU; if so, the main control MCU feeds back the signal regarding to the under-voltage state to the display control circuit and the charging control circuit; the display control circuit sends out the signal, and the charging control circuit receives the signal and continues to charge the battery until the battery is fully charged.

6. The high-frequency electromagnetic induction control circuit of claim 1, wherein the keyboard control circuit is configured to control the main control MCU to operate or stop operating, to switch a working mode and power of the main control MCU, to feed back information with regard to a working state, the working mode and power of the main control MCU to the display control circuit; and the display control circuit is configured to display the information.

7. The high-frequency electromagnetic induction control circuit of claim 1, wherein the drive circuit is equivalent to a step-up transformer to increase the DC voltage from the battery.

8. The high-frequency electromagnetic induction control circuit of claim 1, wherein the high-frequency heating circuit comprises a capacitor and an inductor; the high-frequency heating circuit is configured to oscillate a DC voltage output from the drive circuit to produce the electromagnetic wave, and to change positive and negative directions of the DC voltage periodically, thereby generating the high-frequency alternating voltage and current, and to output the high-frequency alternating voltage and current to the induction heating circuit.

9. The high-frequency electromagnetic induction control circuit of claim 8, wherein the induction heating circuit comprises a metal coil and a metal container; the high-frequency alternating voltage and current pass through the metal coil to produce the induced magnetic field, and the metal container is heated in the induced magnetic field.

\* \* \* \* \*